(12) United States Patent
Arakawa et al.

(10) Patent No.: US 6,911,774 B2
(45) Date of Patent: Jun. 28, 2005

(54) ELECTROLUMINESCENT DISPLAY DEVICE WITH ULTRAVIOLET PROTECTION FILM

(75) Inventors: Masahiko Arakawa, Anpachi-gun (JP); Ryuji Nishikawa, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/402,378

(22) Filed: Mar. 31, 2003

(65) Prior Publication Data

US 2003/0230971 A1 Dec. 18, 2003

(30) Foreign Application Priority Data

Mar. 29, 2002 (JP) ......................................... 2002-095449

(51) Int. Cl.[7] ............................. H01J 1/62; H01J 63/04
(52) U.S. Cl. ...................... 313/506; 313/504; 313/512
(58) Field of Search ................................ 313/506, 500, 313/504, 509, 512; 349/69, 42

(56) References Cited

U.S. PATENT DOCUMENTS

| | | | |
|---|---|---|---|
| 6,219,113 B1 | * | 4/2001 | Takahara ..................... 349/42 |
| 2002/0140879 A1 | * | 10/2002 | Fujieda ........................ 349/69 |
| 2003/0067266 A1 | * | 4/2003 | Kim et al. .................. 313/504 |

* cited by examiner

*Primary Examiner*—Joseph Williams
*Assistant Examiner*—Kevin Quarterman
(74) *Attorney, Agent, or Firm*—Morrison & Foerster LLP

(57) ABSTRACT

An electroluminescent display device includes an anode, a cathode and a light emitting layer disposed between the anode and the cathode. The display device also includes a substrate allowing light from the light emitting layer to pass through itself and an ultraviolet protection film disposed in an optical path of the light passing through the substrate. Retardation films and polarizers used in conventional electroluminescent display devices are replaced by the ultraviolet protection film with respect to reducing the effect of ultraviolet rays on the degradation of the display characteristics.

18 Claims, 6 Drawing Sheets

Prior Art         Prior Art

Prior Art

ELECTROLUMINESCENT DISPLAY DEVICE WITH ULTRAVIOLET PROTECTION FILM

BACKGROUND OF THE INVENTION

1. Field of the Invention

This invention relates to an electroluminescent (EL) display device, specifically to an EL display device that includes an ultraviolet protection film.

2. Description of the Related Art

FIG. 6A shows a plan view of a conventional passive-type EL display device, FIG. 6B shows a sectional view of the EL display device along line C—C of FIG. 6A, FIG. 6C shows a sectional view along line D—D of FIG. 6A, and FIG. 6D shows a partially expanded view of FIG. 6C with a conventional ultraviolet cut-off structure.

As shown in FIG. 6A, linear anodes 20, which extend vertically in the figure and are formed from ITO (indium tin oxide) that is a transparent conductive material, and linear cathodes 30, which extend horizontally in the figure, are placed on an insulating substrate 10. At the intersections of the vertical anodes 20 and the horizontal cathodes 30, organic EL layers 25 having light emitting layers formed from an organic material are provided between the anodes 20 and the cathodes 30. This three-layer structure forms an organic EL element 31.

As shown in FIG. 6D, the anode 20 formed of a transparent conductive film is provided on the insulating substrate 10. The organic EL layer 25 formed on the anode 20 includes a hole transporting layer 21 having a first hole transporting layer made of MTDATA (4,4',4"-tris(3-methylphenylphenylamino)triphenylamine) and a second hole transporting layer made of TPD (N,N'-diphenyl-N,N'-di(3-methylphenyl)-1,1'-biphenyl-4,4'-diamine), a light emitting layer 22 made of Bebq2 (10-benzo[h]quinolinol-beryllium complex) containing quinacridone derivative, and an electron transporting layer 23 made of Bebq2. Furthermore, the cathode 30 made of aluminum (Al) is formed on the EL layer 25. This cathode 30 is an opaque conductive film, and light emitted from the light emitting layer 22 passes through the insulating substrate 10 as the light for the display device. An insulating film 24 is placed between the anode 20 and the cathode 30.

A sealing substrate (not shown) is attached to the insulating substrate 10 to cover the cathode of the insulating substrate 10, and the organic EL element 31 as well as associated thin film transistors (TFT) are sealed between this sealing substrate and the insulating substrate 10. This sealing substrate may be a metal or a glass. The organic EL layer 25 is not resistant to moisture, and therefore, it is desirable that the sealing is completed as quickly as possible.

External light 100 also enters the display device, and this light is reflected by the cathode 30 formed of an Al layer. This reflected light adds to the brightness of the display device. For example, in a black representation by the display device, a proper black representation cannot be obtained. Therefore, as shown in FIG. 6D, a retardation film 51 and a circular polarizer 52 are provided on the insulating substrate to cut the light reflected by the cathode 30 to achieve the proper black representation.

Since the transmission of the circular polarizer 52 is approximately 40% through 50%, only about a half of the light generated at the light emitting layer 22 is used as display light. Accordingly, this low light transmission of the circular polarizer 52 coupled with the retardation film 51 reduces the amount of ultraviolet rays that reaches the organic EL layer 25. The conventional display device relies on the circular polarizer 52 and the retardation film 51 to maintain a proper life time of the organic EL layer, which is subject to an accelerated light emission character degradation upon illumination by ultraviolet rays.

SUMMARY OF THE INVENTION

The invention provides an electroluminescent display device that includes an anode, a cathode and a light emitting layer disposed between the anode and the cathode. The display device also includes a substrate allowing light from the light emitting layer to pass through itself and an ultraviolet protection film disposed in an optical path of the light passing through the substrate.

The invention also provides an electroluminescent display device that includes a substrate having a thin film transistor thereon, and an ultraviolet protection film disposed over the thin film transistor and having an average transmission at visible region at least 80 times as high as an average transmission at ultraviolet region. The display device also includes an anode disposed over the ultraviolet protection film, a light emitting layer disposed over the anode and being driven by the thin film transistor, and a cathode disposed over the light emitting layer.

The invention further provides an electroluminescent display device that includes a first substrate having a thin film transistor thereon, an anode disposed over the first substrate, a light emitting layer disposed over the anode and being driven by the thin film transistor, and a cathode disposed over the light emitting layer. The display device also includes a second substrate disposed over the light emitting layer, and an ultraviolet protection film disposed on a surface of the second substrate and having an average transmission at visible region at least 80 times as high as an average transmission at ultraviolet region.

The invention also provides an electroluminescent display device that includes an anode, a cathode, a light emitting layer disposed between the anode and the cathode, a substrate which light from the light emitting layer passes through, and means for preventing an ultraviolet ray from reaching the light emitting layer.

DETAILED DESCRIPTION OF THE INVENTION

A passive-type EL display device with a bottom emission structure is described as a first embodiment of the invention.

Figure 1A:
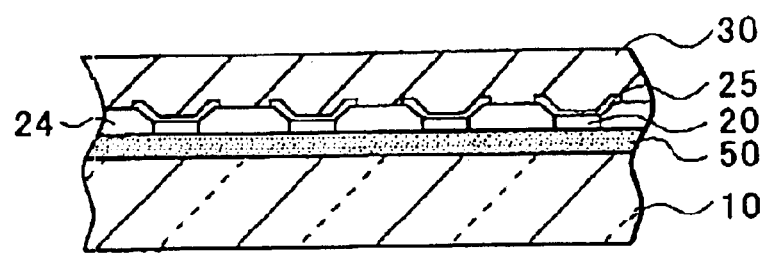
FIG. 1A is a cross-sectional view of an electroluminescent display device of a first embodiment of the invention.
Figure 1B:
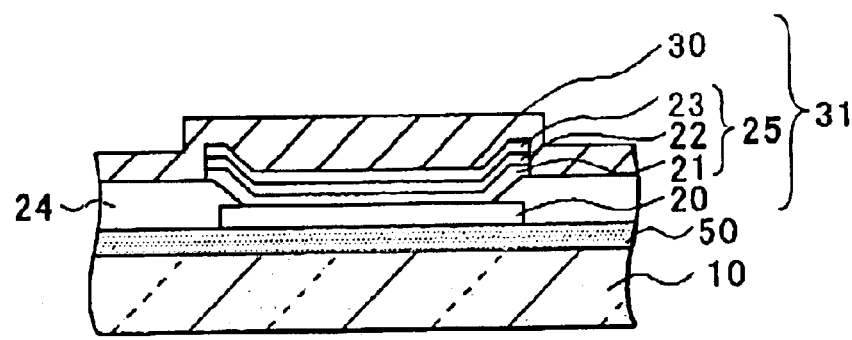
FIG. 1B is a partially expanded view of FIG. 1A.
Figure 6A:
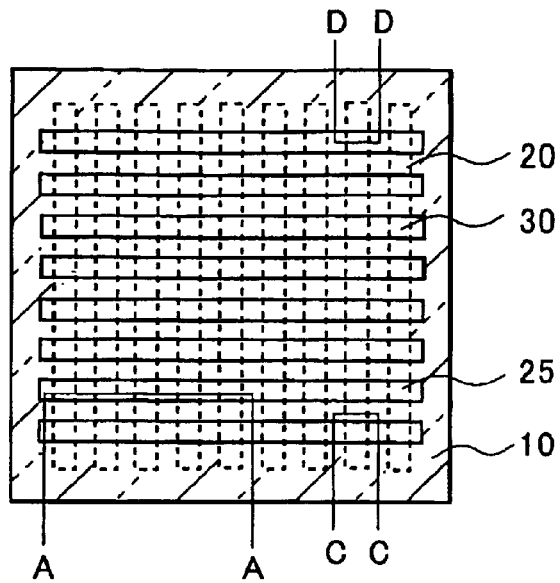
FIG. 6A is a plan view of a conventional bottom emission electroluminescent display device.
Figures 6B, 6C:
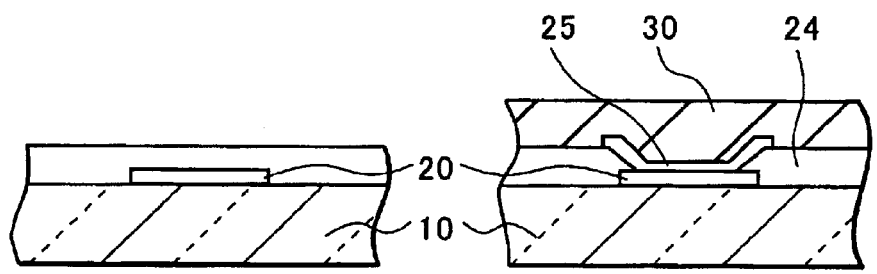
FIGS. 6B–6D are cross-sectional views of the display device of FIG. 6A.

The plan view of this display device is the same as that of FIG. 6A. FIG. 1A is a cross-sectional view of this display device cut along line A—A of FIG. 6A. FIG. 1B is a partially expanded view of FIG. 1A showing the detailed structure of the display device. The components of this embodiment that are the same as the components of the display device of FIG. 6A are indicated by the same reference numerals.

An ultraviolet protection film 50 formed by applying an acrylic transparent resin is provided on the entire surface of an insulating substrate 10. This film has a thickness of approximately 1.2 $\mu$m, and has a transmission characteristics, which allow higher transmission of visible rays than ultraviolet rays. As shown in FIG. 6A, linear anodes 20 made of ITO extend vertically in the figure, and linear cathodes 30 extend horizontally in the figure. An organic EL element 31, which includes the anode 20, the cathode 30 and organic EL layers 25 having light emitting layers made of an organic material placed between the two electrodes 20, 30, is provided at the intersections of the anodes 20 extending vertically and the cathodes 30 extending horizontally.

As shown in FIG. 1B, the anode 20 is provided on the insulating substrate 10. The organic EL layer 25 formed on the anode 20 includes a hole transporting layer 21 having a first hole transporting layer made of MTDATA (4,4',4"-tris (3-methylphenylphenylamino)triphenylamine) and a second hole transporting layer made of TPD (N,N'-diphenyl-N,N'-di(3-methylphenyl)-1,1'-biphenyl-4,4'-diamine), a light emitting layer 22 made of Bebq2 (10-benzo[h]quinolinol-beryllium complex) containing quinacridone derivative, and an electron transporting layer 23 made of Bebq2. Furthermore, the cathode 30 made of Al is formed on the EL layer 25. This cathode 30 is an opaque conductive film, and light emitted from the light emitting layer 22 passes through the insulating substrate 10 as the light for the display device. This structure is a typical bottom emission structure, which allows viewing of light through the substrate 10.

As is the case with the display device of FIG. 6A, a sealing substrate (not shown) is attached to the insulating substrate 10 to cover the cathode of the insulating substrate 10, and the organic EL element 31 as well as associated TFTs are sealed between this sealing substrate and the insulating substrate 10. This sealing substrate may be a metal or a glass. An antireflection film (not shown) made of molybdenum is placed between the anode 20 and the insulating substrate 10 to reduce the reflection of incoming external light. This antireflection film may be placed on any surface that reflects the incident light. Accordingly, this embodiment does not require the polarizer or the retardation film of the display device of FIG. 6A.

The ultraviolet protection film 50 of this embodiment has a transmission of 80% or higher as an average over the visible region and a transmission of 1% or lower as an average over the ultraviolet region. In this embodiment, a film that has a visible-range transmission at least 80 times as high as the ultraviolet-range transmission is effectively used as the ultraviolet protection film.

By providing this ultraviolet protection film 50, the organic EL element 31 can be protected from ultraviolet rays without using a circular polarizer or the retardation film. As described above, the retardation film and the polarizer allow transmission of only about 40–50%, though the polarizer contributes to the low transmission much more than the retardation film does. This low transmission does not depend much on the wavelength, and almost constant throughout the entire wavelength region, i.e., ultraviolet to visible. On the other hand, the ultraviolet protection film 50 of this embodiment has a much higher transmission, i.e., 80% or higher, at the visible region than at the ultraviolet region. Accordingly, since visible rays are effectively transmitted through the ultraviolet protection film 50, the configuration of this embodiment utilizes light from the light emitting layer 22 much more effectively as display light than the configuration of the conventional display device.

Figure 1C:
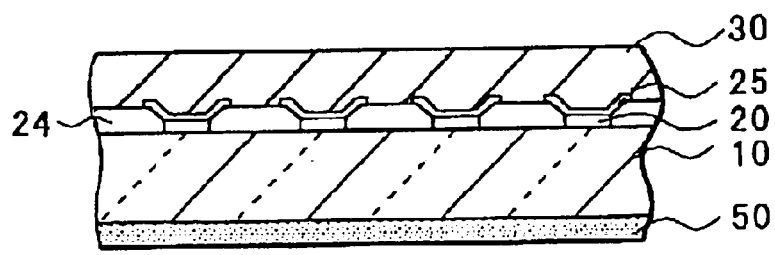
FIG. 1C is a cross-sectional view the display device of FIG. 1A with a modification.

The ultraviolet protection film 50 may be attached to the observer side of the insulating substrate 10 as shown in FIG. 1C. Namely, the ultraviolet protection film 50 is provided on the external surface of the insulating substrate 10. Because of the ultraviolet protection film 50, the display device of this embodiment does not need the retardation film or the polarizer to protect the organic EL layer 25 from ultraviolet rays. Light from the light emitting layer 22 passes through the insulating substrate 10 and is viewed by an observer. As is the case with the display device of FIG. 1A, the organic EL layers 25, the two electrodes 20, 30 and the TFTs are placed on the inner side of the substrate 10.

Furthermore, the ultraviolet protection film 50 may be placed anywhere in the optical path from the light emitting layer 22 to the observer, and does not have to be placed on the insulating substrate 10. For example, when the EL display device is used as a display component of a mobile telephone or mobile computing device, the ultraviolet protection film 50 may be placed outside the EL display device itself to cover the device when it is exposed to external light during its use.

In this embodiment, the light emitting layer 22, the anode 20 and the insulating substrate 10 form an optical path for radiating light that is generated in the light emitting layer 22. External light enters through the same optical path in the opposite direction.

Ultraviolet rays contained in this external light accelerates the deterioration of the EL layer 25, especially the light emitting layer 22. The ultraviolet protection film 50 may be provided on any of the layers provided in this optical path, though the location of the ultraviolet protection film 50 shown in FIG. 1A is most effective in this embodiment.

Figure 3:
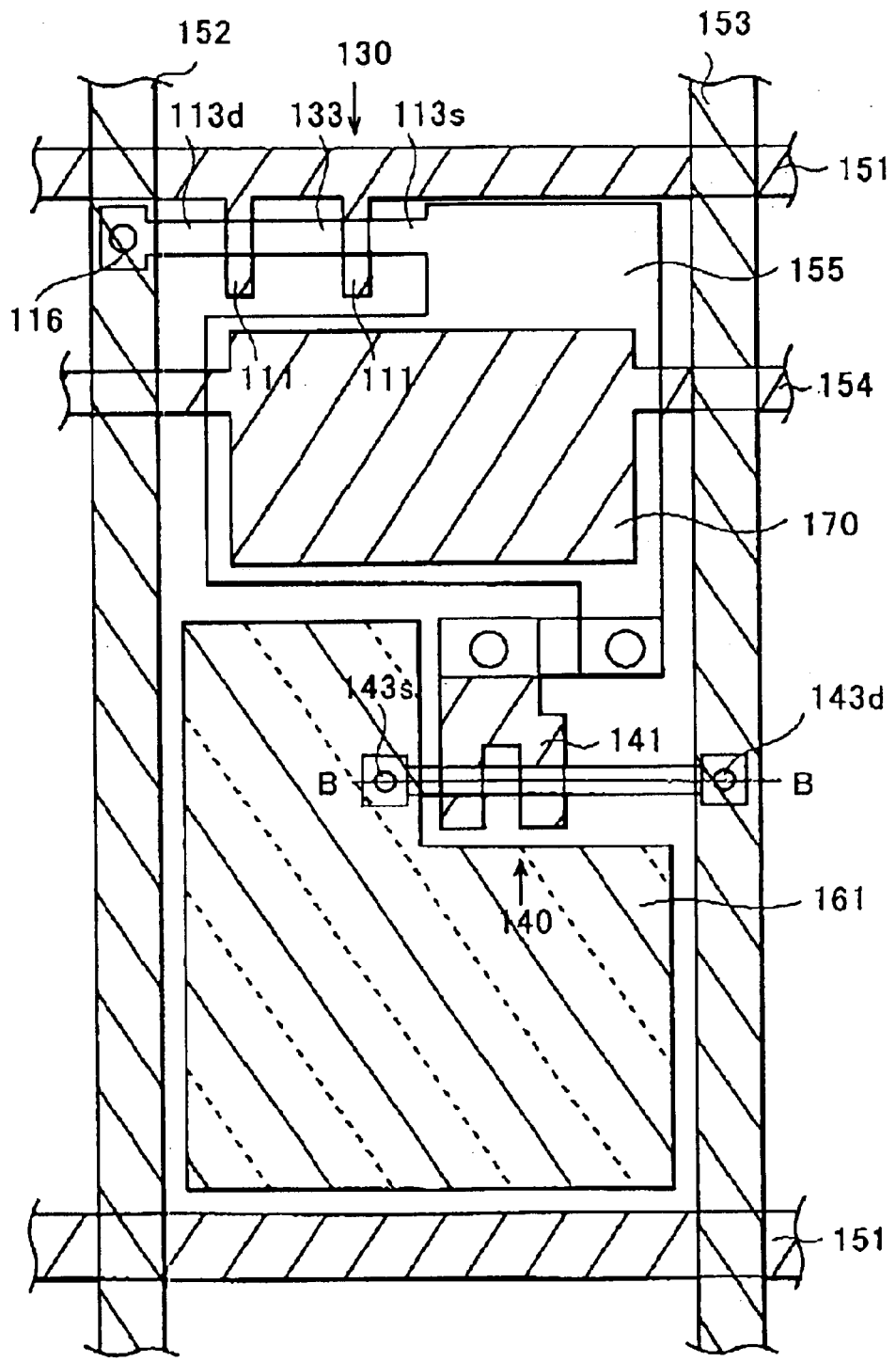
FIG. 3 is a plan view of a pixel element of an electroluminescent display device of a second embodiment of the invention.
Figure 4:
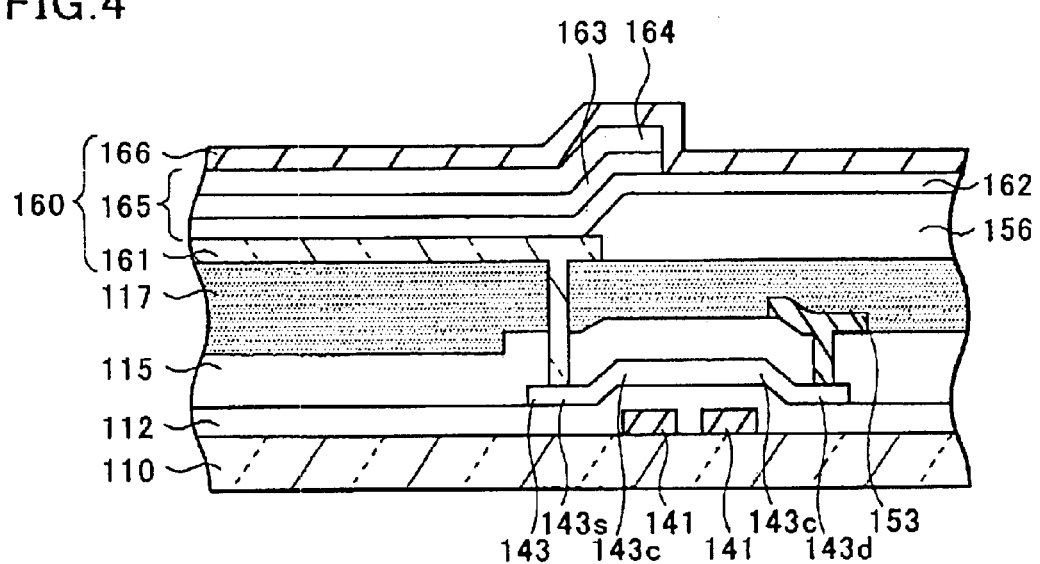
FIG. 4 is a cross-sectional view of the display device of FIG. 3.

FIGS. 3 and 4 show an active-type EL display device with a bottom emission structure of a second embodiment of this embodiment.

Figure 2A:
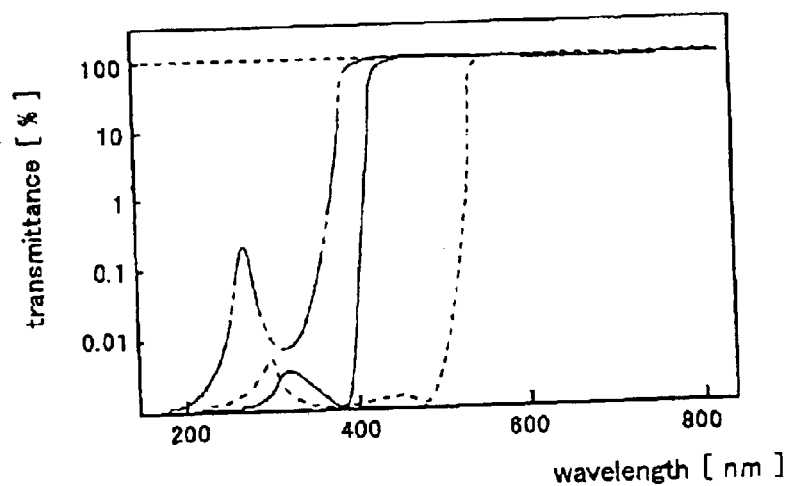
FIG. 2A shows transmissions of three ultraviolet protection films for the device of FIG. 1A as a function of wavelength.
Figure 2B:
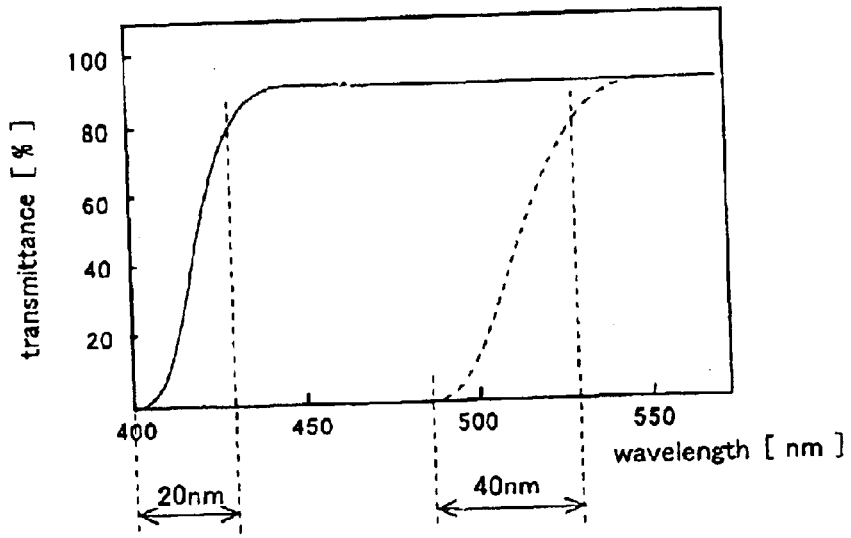
FIG. 2B is a partially expanded view of FIG. 2A.

FIGS. 2A and 2B show the transmission characteristics of ultraviolet protection film 50 of this embodiment. Three acrylic resins were formed as the ultraviolet protection film 50 and the transmission characteristics of the three films were measured. The transmission of the film made of a first resin is indicated by the solid line, that of the film made of a second resin is indicated by the evenly broken line, and that of the film made of a third resin is indicated by the unevenly broken line in FIG. 2A, which has the Y-axis in the logarithmic scale. Only those of the first resin and the second resin are shown in FIG. 2B, which is a partially expanded view along the X-axis of FIG. 2A. All of the three resins show, when they are formed as a ultraviolet protection film, a low transmission at the ultraviolet region, and thus generally qualify as the ultraviolet protection film 50.

However, closer examination of the transmission characteristics reveals preferences of the resins to be used as the ultraviolet protection film of this invention. First, the film made of the second resin has a transmission of only about 50% even at around 520 nm. The wavelength region around 500 nm is a transition region from blue to violet, and is still visible to human eyes. If the ultraviolet protection film 50 made of the second resin is used in a full color display device, the light emission in the wavelength region must be enhunsted in comparison to the light emissions of other wavelength regions to keep a proper color balance. This leads to an excessive use of the light emitting layer for this wavelength region, and an early degradation of this light emitting layer and the display device itself Accordingly, it is better for the ultraviolet protection film 50 to have not only a low ultraviolet transmission but also a high transmission throughout the visible range. Preferably, the ultraviolet protection film 50 has a transmission equal to or higher than 80% above 430 nm. The device characteristics are further improved if the transmission is equal to or higher than 85% above 430 nm, and equal to or higher than 90% above 440 nm.

Second, the film made of the third resin has a high transmission throughout the visible light region. The transmittance is close to 100% even below 400 nm. Accordingly, this film is good in terms of a full color display application. However, the transmission shows a local maximum of about 0.1% at around 250 nm. Although the transmission of 0.1% may be appropriate for some other ultraviolet protection, it was found that even the transmission at this level eventually contributes to the acceleration of the degradation of the light emitting layer of the organic EL display device. It is better for the transmission not to exceed 0.05% at a wavelength below 350 nm. Preferably, the transmission of the ultraviolet protection film 50 of this invention does not exceed 0.01% at a wavelength below 350 nm.

The film made of the first resin is most suitable, among the three films shown in FIG. 2A, for the ultraviolet protection film 50 of this embodiment. The transmission of this film is equal to or higher than 90% above 440 nm and equal to or higher than 85% above 430 nm, and does not exceed 0.01% at any wavelength below 350 nm.

In addition to these transmission characteristics, the film made of the first resin shows a steep change in the transmission, as shown in FIG. 2B. The transmission remains at its maximum transmission, i.e., approximately 90%, down to about 435 nm, and reduces to about 80% at 425 nm. The transmission further reduces to about 1% at about 405 nm. The transmission changes from 80% to 1% while the wavelength changes by 20 nm. On the other hand, the film made of the second resin shows more gradual change in the transmission. The transmission of this film is 80% at about 515 nm and 1% at about 475 nm. The transmission changes form 80% to 1% while the wavelength changes by 40 rum. It would be the best to have a ultraviolet protection film that has a step-like transition from the ultraviolet region to the visible region and thus provides no reduction of the transmission at the visible violet region. However, such a ultraviolet protection film simply does not exist. Accordingly, the practical approach is to choose a ultraviolet protection film that has an ultraviolet-visible transition as steep as possible. The less is the reduction of the transmission at the visible violet region, i.e., a steeper transition, the less complicated is the devise design to compensate for this reduction of the transmission.

Preferably, the change in the transmission from 1% to the maximum transmission subtracted by 10% occurs while the wavelength changes by 40 nm or less. More preferably, the same change in the transmission occurs while the wavelength change by 20 nm or less.

FIG. 3 shows a plan view showing one display pixel of the organic EL display device, and FIG. 4 shows a sectional view along line B—B of FIG. 3.

As shown in FIG. 3, a display pixel is formed in the region surrounded by a plurality of gate signal lines 151 extending in a row direction and a plurality of drain signal lines 152 extending in a column direction. A switching TFT 130 is provided in the vicinity of the intersection between these signal lines, and the source 113s of the TFT 130 serves simultaneously as a capacitor electrode 155 that has a capacitance between itself and a retaining capacitor electrode 154, and is connected to the gate 141 of a second TFT 140 that drives the organic EL element 160. The source 143s of the second TFT 140 is connected to the anode 161 of the organic EL element 160, and the drain 143d at the other side is connected to a drive power supply line 153 that drives the organic EL element 160.

In the vicinity of the TFT, the retaining capacitor electrode 154 is disposed parallel to the gate signal line 151. This retaining capacitor electrode 154 is made of chromium, and has a capacitance between itself and the capacitor electrode 155 that is connected to the source 113s of the switching TFT 130 via a gate insulating film 112. This retaining capacitor 170 is provided for retaining a voltage to be applied to the gate 141 of the second TFT 140.

The cathode 166 of the organic EL element 160 is provided over the entire substrate 110 of the organic EL display device.

In the second TET 140, a gate electrode 141 made of a high melting point metal, such as Cr and Mo, or its alloy is provided on the insulating substrate 110 made of a non-alkali glass, and a gate insulating film 112 and an active layer 143 formed of a poly-silicon film are formed in this order. The active layer 143 is provided with a channel 143c that is intrinsic or substantially intrinsic above the gate electrode 141, and a source 143s and a drain 143d at both sides of this channel 143c, which are formed by ion doping.

An interlayer dielectric layer 115 including an $SiO_2$ film, an SiN film, and an $SiO_2$ film that are laminated in this order is formed on the entire upper surfaces of the gate insulating film 112 and the active layer 143. A contact hole made in accordance with the drain 143d is filled with a metal such as Al, to form a drive power supply line 153 connected to a drive power supply.

An ultraviolet protection film 117 made of, for example, an acrylic transparent resin is further formed on the entire surface. This ultraviolet protection film 117 has the transmission characters as the ultraviolet protection film 50 of the first embodiment.

A contact hole is formed in the ultraviolet protection film 117 and the interlayer dielectric layer 115 at a position corresponding to the source 143s, and a transparent electrode made of ITO, that is, an anode 161 of an organic EL element 160, which is in contact with the source 143s through this contact hole, is provided on the ultraviolet protection film 117. An antireflection film (not shown) made of molybdenum is placed between the anode 161 and the ultraviolet, protection film 117.

The organic EL element 160 includes the same components as the first embodiment. An organic EL layer 165 is formed on the anode 161. The organic EL layer 165 includes a hole transport layer 162, a light emitting layer 163 and an electron transport layer 164. A cathode 166 is formed on the electron transport layer 164. The step at the edge of the anode 161 may break the organic EL layer 165 if the organic EL layer 165 is formed over the step. To prevent this breaking of the organic EL layer 165 at the step, a second flattening film 156 is disposed under the electron transporting layer 162.

A sealing substrate (not shown) is attached to the cathode side of the substrate 110, and the TFT and the EL element are sealed between this sealing substrate and the insulating substrate 110. This sealing substrate can be formed from either a metal or a glass. In this embodiment, the retardation film or the polarizer of the conventional display device is not required to protect the organic EL layer 165 from ultraviolet rays.

In the organic EL element 160, holes injected from the anode and electrons injected from the cathode are re-combined inside the light emitting layer 163 and excite organic molecules that form the light emitting layer 163 to generate excitons. In the process of relaxation of the excitons, light is emitted from the light emitting layer 163, and this light is emitted to the outside through the transparent insulating substrate 110 and the transparent anode.

In this embodiment, the light emitting layer 163, the anode 161 and the transparent insulating substrate 110 form an optical path for radiation of light emitted from the light emitting layer 163, and external light enters the display device along the same optical path in the opposite direction.

This embodiment is characterized in that an ultraviolet protection film 117 is formed in this optical path. When the film made of the first resin shown in FIGS. 2A and 2B is used as the ultraviolet protection film in this embodiment, the transmission of the ultraviolet rays is less than 0.01%. Thus, even when the circular polarizer or the retardation film of the conventional display device is not provided, deterioration of the organic EL element 160 due to ultraviolet rays can be prevented. Particularly, as in this embodiment, it is preferred that the ultraviolet protection film 117 is formed from an acrylic resin between the anode 161 and the TFTs. The reason for use of an acrylic resin is that the acrylic resin cuts off ultraviolet rays, and at the same time is able to make the surface of the device intermediate flat enough for the subsequent processing steps. Accordingly, the ultraviolet protection film 117 also serves as a flattening film. When the first resin shown in FIGS. 2A and 2B is used, the ultraviolet protection film, which is also the flattening film, is applied on the substrate by spin coating.

The ultraviolet protection film 117 may be provided on any of the layers as long as the ultraviolet protection film 117 is placed closer to an observer than the EL layer 165.

Furthermore, the ultraviolet protection film of the first and second embodiments may be applied to an EL display device with a top emission structure. The description given below employs a passive-type EL display device as an example. However, the ultraviolet protection film may also be applied to an active matrix type EL display device with a top emission structure.

Figure 5A:
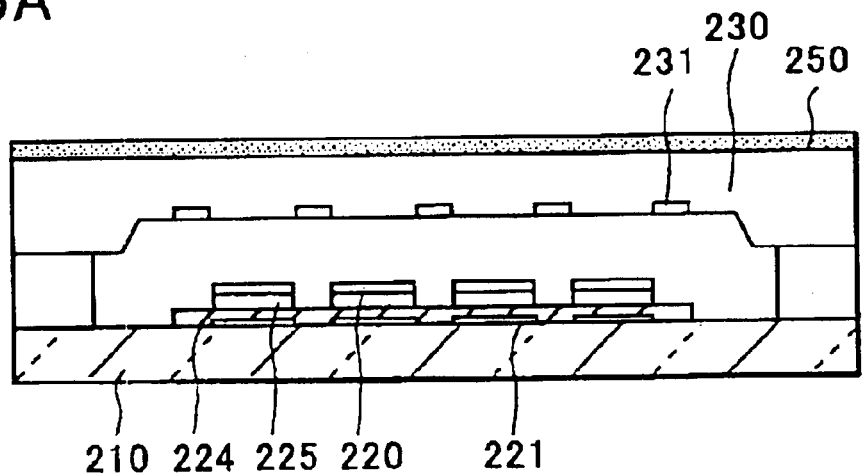
FIGS. 5A and 5B are sectional views of the display devices of FIG. 1A modified for a top emission structure.
Figure 5B:
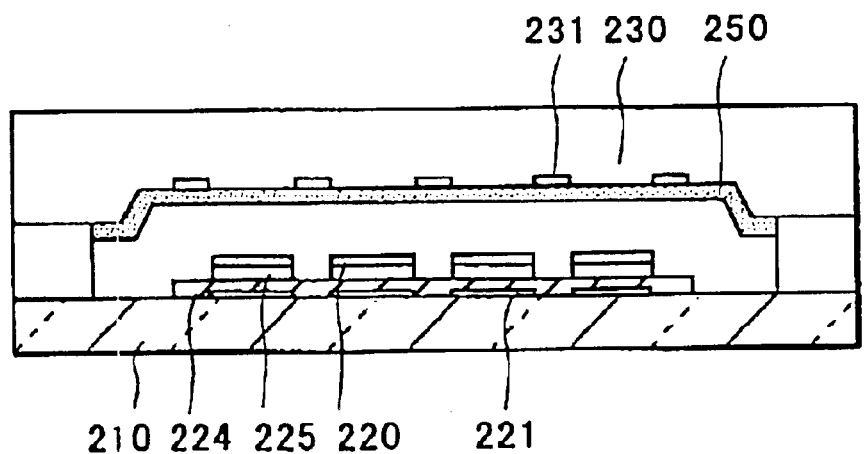

The difference between the top emission structure and the bottom emission structure is that light is viewed through a sealing substrate 230 in the top emission structure, and that light is viewed through an insulating substrate 110 in the bottom emission structure. The configuration of the top emission structure is the same as the bottom emission structure shown in FIG. 4 except that the cathode is formed by laminating an extremely thin metal film and a transparent electrode made of ITO or IZO (indium zinc oxide). Furthermore, as shown in FIGS. 5A and 5B, the lamination order of the layers in the organic EL element 160 may be reversed. In such a configuration, a common cathode 224 is placed at the bottom of the organic EL element 160, and a anode 161 made of ITO is placed at the top of the organic EL element 160 Namely, the lowest layer is the cathode 224. An organic EL layer 225 including an electron transporting layer, a light emitting layer 164 and a hole transporting layer is placed on the cathode 224. The anode 220 including an ITO film and a film of Ag/Mg alloy is provided on the organic EL layer.

An antireflection film (not shown) is placed on the anode 220. Light emitted from the light emitting layer 164 of the organic El element 225 passes through a transparent sealing substrate 230, and reaches an observer of the display device. An ultraviolet protection film 250 is placed in the optical path of the light emitted from the light emitting layer 164 and passing through the sealing substrate 230. In the bottom emission structure shown in FIG. 4, the ultraviolet protection film is spin-coated on the substrate before the formation of the organic EL element. However, in the top emission structure, the spin coating is not appropriate since the coating solution may penetrate into the organic EL elements that are already formed on the substrate prior to the formation of the ultraviolet protection film. In this embodiment, the ultraviolet protection film 250 is formed on the external surface of the sealing substrate 230 as shown in FIG. 5A, or on the internal surface of the sealing substrate 230 as shown in FIG. 5B. The sealing substrate 230 is attached to the anode side of the insulating substrate 210, and the TFTs and the EL element are sealed between the sealing substrate 230 and the insulating substrate 210.

In the organic EL element 160, holes injected from the anode 220 and electrons injected from the cathode 224 are re-combined inside the light emitting layer and excite organic molecules forming the light emitting layer to generate excitons. In the process of relaxation of the excitons, light is emitted from the light emitting layer. This light passes through the sealing substrate 230 and the transparent anode 220. to. escape from the sealing substrate side of the display device.

In this embodiment, the light emitting layer, the anode 220 and the sealing substrate 230 form an optical path.

In the top emission structure, an observer views light through the sealing substrate 230, so that the sealing substrate 230 may be formed of a transparent substrate such as a glass or an acrylic substrate. However, since this sealing substrate is used for preventing the entry of moisture, a glass substrate is preferable. Furthermore, on the sealing substrate 230, in order to prevent the wiring between the pixels from being viewed, a black matrix 231 is provided. Furthermore, on the insulating substrate 210, a reflector 221 for preventing light penetration is provided. An ultraviolet protection film 250 is provided by an application of an acrylic resin.

The top emission structure has fewer restrictions in design of the numerical aperture than in the bottom emission structure, so that the numerical aperture can be larger than that of the bottom emission structure having the same pixel area.

The ultraviolet protection film 250 may be also provided on the EL element side of the display device, as shown in FIG. 5B. Either way, the ultraviolet protection film 250 may be provided on any of the layer as long as the ultraviolet protection film is placed closer to an observer than the organic EL layer 225.

Figure 6D:
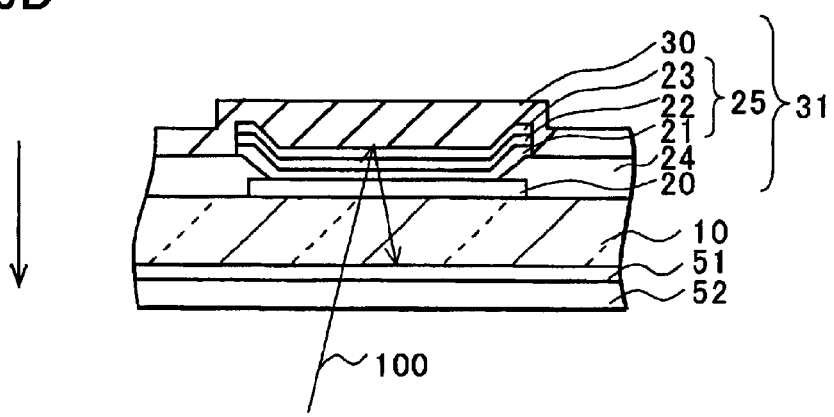

The display devices of these embodiments achieve a display use period equal to or longer than that of the conventional display device of FIG. 6D, which includes the polarizer and the retardation film. Furthermore, because the display devices of these embodiments do not need the polarizer and the retardation film of the conventional display device required for reducing the amount of ultraviolet rays entering the EL elements, much simpler structures designed only for preventing the internal light reflection may be provided together with the ultraviolet protection layer.

Therefore, the structure of the display device may become significantly less complicated.

What is claimed is:

1. An electroluminescent display device comprising:
   an anode;
   a cathode;
   a light emitting layer disposed between the anode and the cathode;
   a substrate which light from the light emitting layer passes through; and
   an ultraviolet protection film disposed in an optical path of the light passing through the substrate, the ultraviolet protection film having a substantially lower transmission at 400 nm than at 600 nm.

2. The electroluminescent display device of claim 1, wherein the ultraviolet protection film has a transmission of 80% or higher as an average over visible region and a transmission of 1% or lower as an average over ultraviolet region.

3. The electroluminescent display device of claim 1, wherein the ultraviolet protection film has an average transmission in the visible region at least 80 times as high as an average transmission in the ultraviolet region.

4. The electroluminescent display device of claim 1, wherein the ultraviolet protection film is disposed between the substrate and the light emitting layer.

5. The electroluminescent display device of claim 1, wherein the ultraviolet protection film is in contact with the substrate.

6. The electroluminescent display device of claim 1, 2, 3 or 4, wherein
   the anode is disposed over the substrate, the light emitting layer is disposed over the anode, and the cathode is disposed over the light emitting layer, and
   the ultraviolet protection film comprises a flattening film covering a thin film transistor that drives the light emitting layer.

7. The electroluminescent display device of claim 1, 2, 3 or 4, further comprising an insulating substrate, wherein the anode is disposed over the insulating substrate, the light emitting layer is disposed over the anode, the cathode is disposed over the light emitting layer, and the ultraviolet protection film is disposed on the substrate which light from the light emitting layer passes through.

8. The electroluminescent display device of claim 1, 2, 3 or 4, wherein the ultraviolet protection film is made of an acrylic resin.

9. The electroluminescent display device of claim 1, 2, 3 or 4, wherein a transmission of the ultraviolet protection film of any wavelength below 400 nm does not exceed 1%.

10. The electroluminescent display device of claim 1, 2, 3 or 4, wherein a transmission of the ultraviolet protection film of any wavelength below 400 nm does not exceed 0.01%.

11. The electroluminescent display device of claim 1, 2, 3 or 4, wherein a transmission of the ultraviolet protection film of any wavelength above 430 nm does not fall below 80%.

12. The electroluminescent display device of claim 1, 2, 3 or 4, wherein a transmission of the ultraviolet protection film of any wavelength above 440 nm does not fall below 90%.

13. The electroluminescent display device of claim 1, 2, 3 or 4, wherein a transmission of the ultraviolet protection film changes from 1% to the maximum transmission subtracted by 10% for an increment of wavelength of 40 nm or less.

14. The electroluminescent display device of claim 8, wherein the ultraviolet protection layer has a thickness of approximately 1.2 $\mu$m.

15. The electroluminescent display device of claim 1, wherein the ultraviolet protection film does not have a transmission of 1% or higher at a wavelength of 400 nm or shorter.

16. An electroluminescent display device comprising:
    a substrate having a thin film transistor thereon;
    an ultraviolet protection film disposed over the thin film transistor and having an average transmission at visible region at least 80 times as high as an average transmission at ultraviolet region;
    an anode disposed over the ultraviolet protection film;
    a light emitting layer disposed over the anode and being driven by the thin film transistor; and
    a cathode disposed over the light emitting layer.

17. An electroluminescent display device comprising:
    a first substrate having a thin film transistor thereon;
    an anode disposed over the first substrate;
    a light emitting layer disposed over the anode and being driven by the thin film transistor;
    a cathode disposed over the light emitting layer;
    a second substrate disposed over the light emitting layer; and
    an ultraviolet protection film disposed on a surface of the second substrate and having an average transmission in the visible region at least 80 times as high as an average transmission in the ultraviolet region.

18. An electroluminescent display device comprising:
    an anode;
    a cathode;
    a light emitting layer disposed between the anode and the cathode;
    a substrate which light from the light emitting layer passes through; and
    means for preventing an ultraviolet ray from reaching the light emitting layer.

* * * * *